US012763790B2

(12) United States Patent
Shill

(10) Patent No.: US 12,763,790 B2
(45) Date of Patent: Oct. 13, 2026

(54) SWITCH REGULATOR

(71) Applicant: Texas Instruments Incorporated, Dallas, TX (US)

(72) Inventor: Mark Shill, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 269 days.

(21) Appl. No.: 18/589,612

(22) Filed: Feb. 28, 2024

(65) Prior Publication Data

US 2025/0274138 A1 Aug. 28, 2025

(51) Int. Cl.

*H03M 1/66* (2006.01)
*H02M 3/155* (2006.01)
*H03K 17/56* (2006.01)
*H03K 17/16* (2006.01)
*H03M 1/10* (2006.01)

(52) U.S. Cl.

CPC ............. *H03M 1/66* (2013.01); *H02M 3/155* (2013.01); *H03K 17/56* (2013.01); *H03K 17/16* (2013.01); *H03M 1/10* (2013.01)

(58) Field of Classification Search

CPC .......... H03M 1/66; H03M 1/10; H02M 3/155; H03K 17/56; H03K 17/16

See application file for complete search history.

(56) References Cited

U.S. PATENT DOCUMENTS 7,330,049 B2 * 2/2008 Perisetty .............. H10D 84/854 326/27

* cited by examiner

*Primary Examiner* — Joseph J Lauture

(74) *Attorney, Agent, or Firm* — Xianghui Huang; Frank D. Cimino

(57) ABSTRACT

A circuit includes an amplifier, a first transistor, a second transistor, and a third transistor. The amplifier has a first amplifier input coupled to a voltage reference terminal; a second amplifier input, and an amplifier output. The first transistor has a first terminal coupled to a power terminal, a second terminal coupled to the second amplifier input, a body terminal coupled to a reference terminal, and a control terminal coupled to the amplifier output. The second transistor has a first terminal coupled to the power terminal, a second terminal, a body terminal coupled to the second terminal of the second transistor, and a control terminal coupled to the amplifier output. The third transistor has a first terminal coupled to the second amplifier input, a second terminal coupled to the reference terminal, and a control terminal coupled to the second terminal of the second transistor.

20 Claims, 4 Drawing Sheets

SWITCH REGULATOR

BACKGROUND

Digital-to-analog converters (DACs) are used in a variety of applications to convert a digital value to an analog signal. For example, a DAC may be used with, or integrated into, a microcontroller or microprocessor to convert digital values to analog signals. Some DACs include a resistor ladder having multiple resistors, e.g., SiCr thin-film or poly-silicon resistors, to generate an analog signal representing a digital value.

SUMMARY

In one example, a circuit includes an amplifier, a first transistor, a second transistor, and a third transistor. The amplifier has a first amplifier input coupled to a voltage reference terminal, a second amplifier input, and an amplifier output. The first transistor having a first terminal coupled to a power terminal, a second terminal coupled to the second amplifier input, a body terminal coupled to a reference terminal, and a control terminal coupled to the amplifier output. The second transistor has a first terminal coupled to the power terminal, a second terminal, a body terminal coupled to the second terminal of the second transistor, and a control terminal coupled to the amplifier output. The third transistor has a first terminal coupled to the second amplifier input, a second terminal coupled to the reference terminal, and a control terminal coupled to the second terminal of the second transistor.

In another example, a circuit includes an amplifier, a resistor, and first, second, third, fourth, fifth, and sixth transistors. The amplifier has a first amplifier input coupled to a voltage reference terminal; a second amplifier input, and an amplifier output. The first transistor has a first terminal coupled to a power terminal; a second terminal coupled to the second amplifier input, a body terminal coupled to a reference terminal, and a control terminal coupled to the amplifier output. The second transistor has a first terminal coupled to the power terminal; a second terminal, a body terminal coupled to the second terminal of the second transistor, and a control terminal coupled to the amplifier output. The third transistor has a first terminal coupled to the second amplifier input, a second terminal, and a control terminal coupled to the second terminal of the second transistor. The resistor has a first terminal coupled to the second terminal of the second transistor, and a second terminal. The fourth transistor has a first terminal, a second terminal, and a control terminal coupled to the second terminal of the second transistor. The fifth transistor has a first terminal, a second terminal, and a control terminal coupled to the first terminal of the fourth transistor. The sixth transistor has a first terminal coupled to the second terminal of the fifth transistor, a second terminal coupled to the reference terminal, and a control coupled to the second terminal of the resistor.

In a further example, a digital-to-analog converter includes a resistor ladder, a switch circuit, a first driver circuit, a second driver circuit, and a switch regulator circuit. The switch circuit is coupled to a rung of the resistor ladder. The switch circuit includes a first switch having a control input and a second switch having a control input. The first driver circuit has an output coupled to the control input of the first switch. The second driver circuit has an output coupled to the control input of the second switch, and a voltage input. The switch regulator circuit has an output coupled to the voltage input of the second driver circuit. The switch regulator circuit includes an amplifier, a first transistor, a second transistor, and a third transistor. The amplifier has a first amplifier input coupled to a voltage reference terminal, a second amplifier input, and an amplifier output. The first transistor has a first terminal coupled to a power terminal, a second terminal coupled to the second amplifier input, a body terminal coupled to a reference terminal, and a control terminal coupled to the amplifier output. The second transistor has a first terminal coupled to the power terminal, a second terminal, a body terminal coupled to the second terminal of the second transistor, and a control terminal coupled to the amplifier output. The third transistor has a first terminal coupled to the second amplifier input, a second terminal coupled to the reference terminal, and a control terminal coupled to the second terminal of the second transistor.

DETAILED DESCRIPTION

Figure 1:
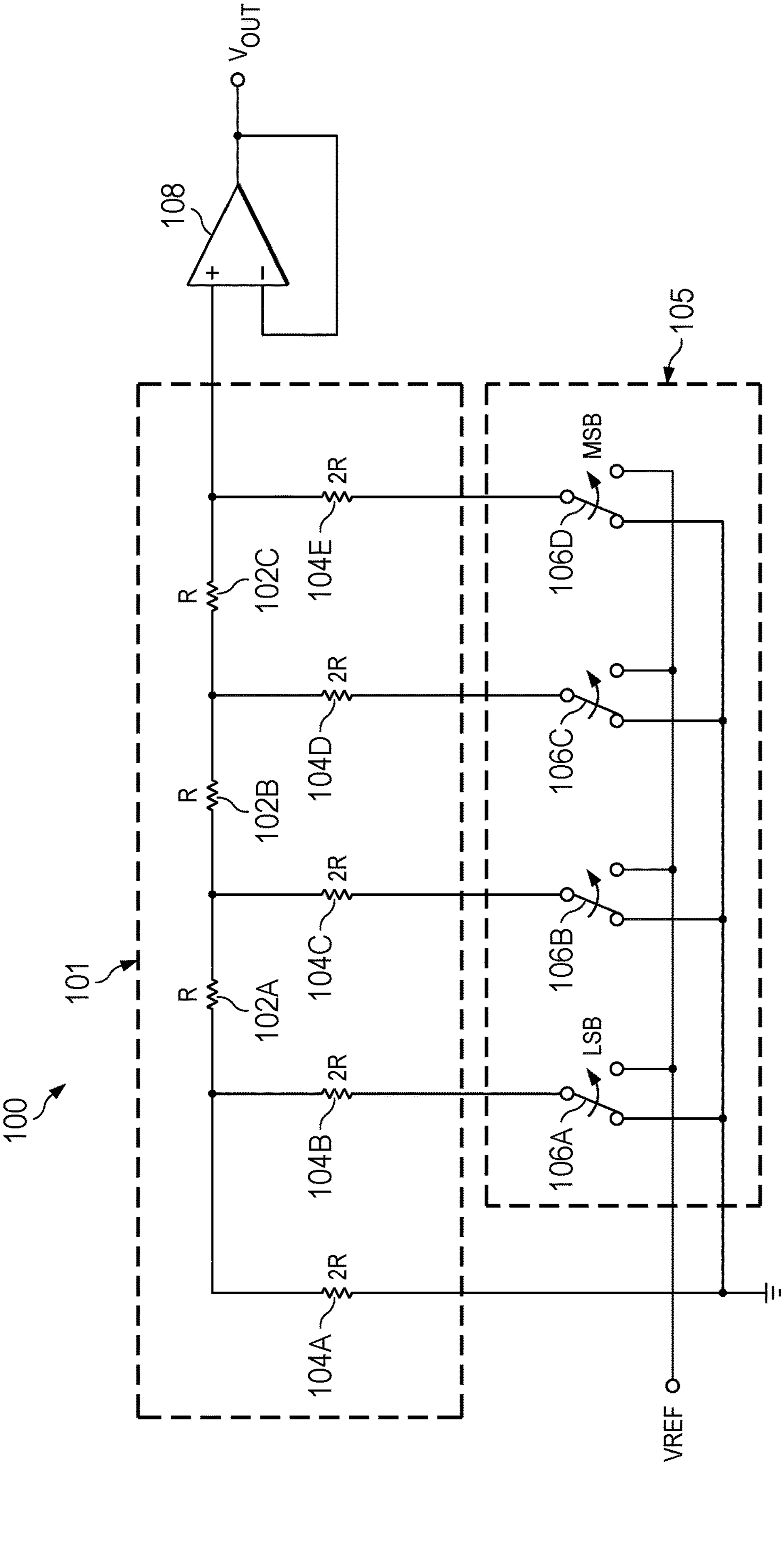
FIG. 1 is a schematic diagram of an example digital-to-analog converter (DAC).

FIG. 1 is a schematic diagram of an example digital-to-analog converter (DAC) 100. The DAC 100 includes a resistor ladder 101, switches 105, and an amplifier 108. The resistor ladder 101 includes resistors 104A, 104B, 104C, 104D, and 104E forming the rungs of the ladder, and resistors 102A, 102B, and 102C forming the rail of the ladder. The resistors 102A, 102B, and 102C may each have resistance R, and the resistors 104A, 104B, 104C, 104D, and 104E may each have resistance 2R.

The resistor ladder 101 is coupled to the switches 105 and the amplifier 108. The resistor ladder 101 binary weights and sums the voltages provided by the switches 105 to generate an output voltage that is provided to the amplifier 108. The amplifier 108 is configured as a voltage follower with a non-inverting input coupled to the resistor ladder 101 and an inverting input coupled to the output of the amplifier 108. The output of the amplifier 108 may be coupled to any circuitry that uses the output signal ($V_{OUT}$) generated by the DAC 100.

The switches 105 includes switches 106A, 106B, 106C, and 106D that are respectively coupled to resistors 104B, 104C, 104D, and 104E. The switches 106A, 106B, 106C, and 106D are illustrated as single-pole double-throw switches having a first terminal coupled to a resistor 104 (e.g., one of the resistors 104A, 104B, 104C, or 104D), a second terminal coupled to a voltage reference terminal (VREF), and a third terminal coupled to ground. The switch 106D represents the most significant bit of digital value and the switch 106A represents the least significant bit of the digital value. Each switch 106 (e.g., switch 106A, 106B, 106C, or 106D) connects the first terminal to the second terminal if the bit of the digital value represented by the switch is a logic one, and connects the first terminal to the third terminal if the bit is a logic zero.

While the DAC 100 is illustrated as a 4-bit DAC, examples of the DAC 100 may include any number of the resistors 102, resistors 104, and switches 106 to form a DAC having a different number of bits (e.g., an 8-bit DAC, 10-bit DAC, 12-bit DAC, 16-bit DAC, etc.).

Figure 2:
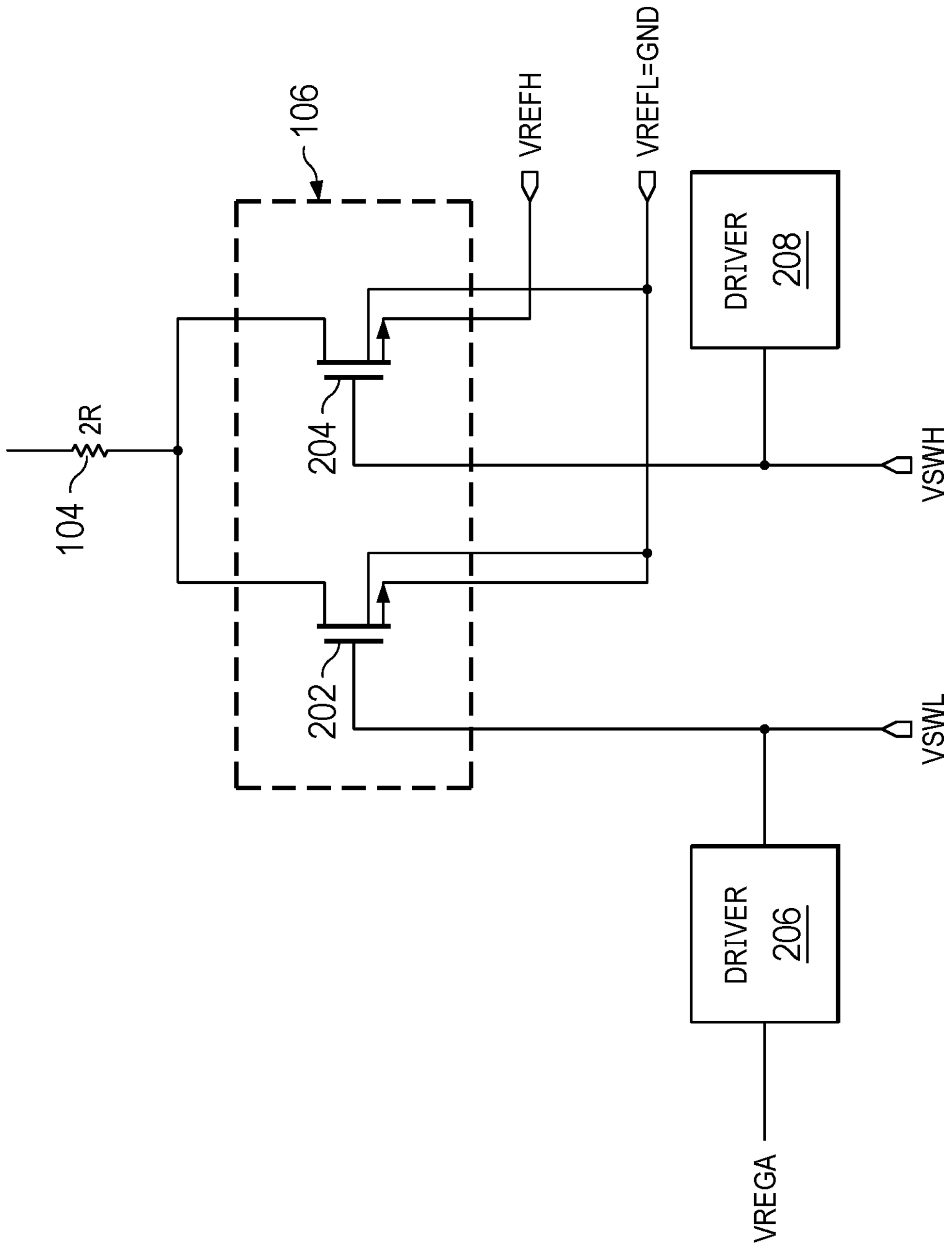
FIG. 2 is a schematic diagram of a switch circuit suitable for use in the DAC of FIG. 1.

FIG. 2 is a schematic diagram of a switch 106 suitable for use in the DAC 100. As explained above, the switch 106 is a single-pole double-throw switch. The switch 106 includes transistors 202 and 204 to provide single-pole double-throw operation. The transistor 202 and the transistor 204 may be n-type field effect transistors (NFETs). A first terminal (e.g., drain) of the transistor 202 is coupled to a resistor 104 of the resistor ladder 101, and to a first terminal (e.g., drain) of the transistor 204. A second terminal (e.g., source) of the transistor 202 is coupled to ground (or other reference voltage terminal representing a logic zero (VREFL)), and a second terminal of the transistor 204 is coupled to a voltage reference terminal that provides a voltage (VREFH) representing a logic one. A control terminal (e.g., gate) of the transistor 202 is coupled to a driver circuit 206 that provides a control signal (VSWL) for turning the transistor 202 on or off. For example, VSWL turns the transistor 202 on if the switch 106 is to provide a logic zero to the resistor 104, and turns the transistor 202 off if a logic one is to be provided to the resistor 104. A control terminal (e.g., gate) of the transistor 204 is coupled to a driver circuit 208 that provides a control signal (VSWH) for turning the transistor 204 on or off. For example, VSWH turns the transistor 204 on if the switch 106 is to provide a logic one to the resistor 104, and turns the transistor 204 off if a logic zero is to be provided to the resistor 104.

In high resolution and high accuracy DACs (e.g., 16-bit resolution and above), the impedance of the switch 106 should be very low and the resistance of the transistor 202 and transistor 204 should be well matched. Accordingly, the transistor 202 and the transistor 204 may have a relatively large W/L size, and be relatively equal in size. The VSWL provided to the transistor 202 may swing to a power supply voltage (AVDD) as the source of the transistor 202 is at ground. However, VSWH provided to the transistor 204 may swing to AVDD-VREF as when on, its source voltage will be at VREF. Accordingly, in some examples of the switches 105, the VSWL may also swing to AVDD-VREF to match VSWH, and with the transistor 202 and transistor 204 having the same size and control voltage, the ideal impedance of the transistor 202 and transistor 204 will be the same, barring any process mismatch in the transistors.

However, the impedances of the transistor 202 and transistor 204 will not be the same with equal gate-to-source (VGS) control voltage if one of the transistors is subject to a back-body voltage effect. The back-body voltage effect, which may also be referred to as body voltage effect or back-gate effect, is a phenomenon whereby the voltage applied to a body terminal of a transistor affects the threshold voltage of the transistor. The back-body voltage effect can be reduced or eliminated simply by tying the well or body terminal of the transistor to its source. This is easily done for a ground potential switch as all GND potential switches are in a common PWELL. The transistor 202 has a back-body terminal that is coupled to the source of the transistor 202. However, for VREF referenced switches such as the transistor 204, to tie the PWELL body terminal to its source requires that the VREF connected switch be isolated (e.g., the body of the transistor be in its own isolated PWELL). Such isolation in some fabrication processes requires a significant increase in the area of the transistor and is therefore impractical. In the switch 106, the body terminal of the transistor 204 is coupled to ground, similar to the transistor 202. While this significantly reduces the layout area of the transistor 204, it does however introduce a VBS or body voltage effect related error in the impedance of the transistor 204. The body-to-source voltage for the transistor 204 can be as much as VREF (e.g., 2.5 volts), creating an impedance mismatch that would reduce accuracy to less than 16-bit performance levels.

Figure 3:
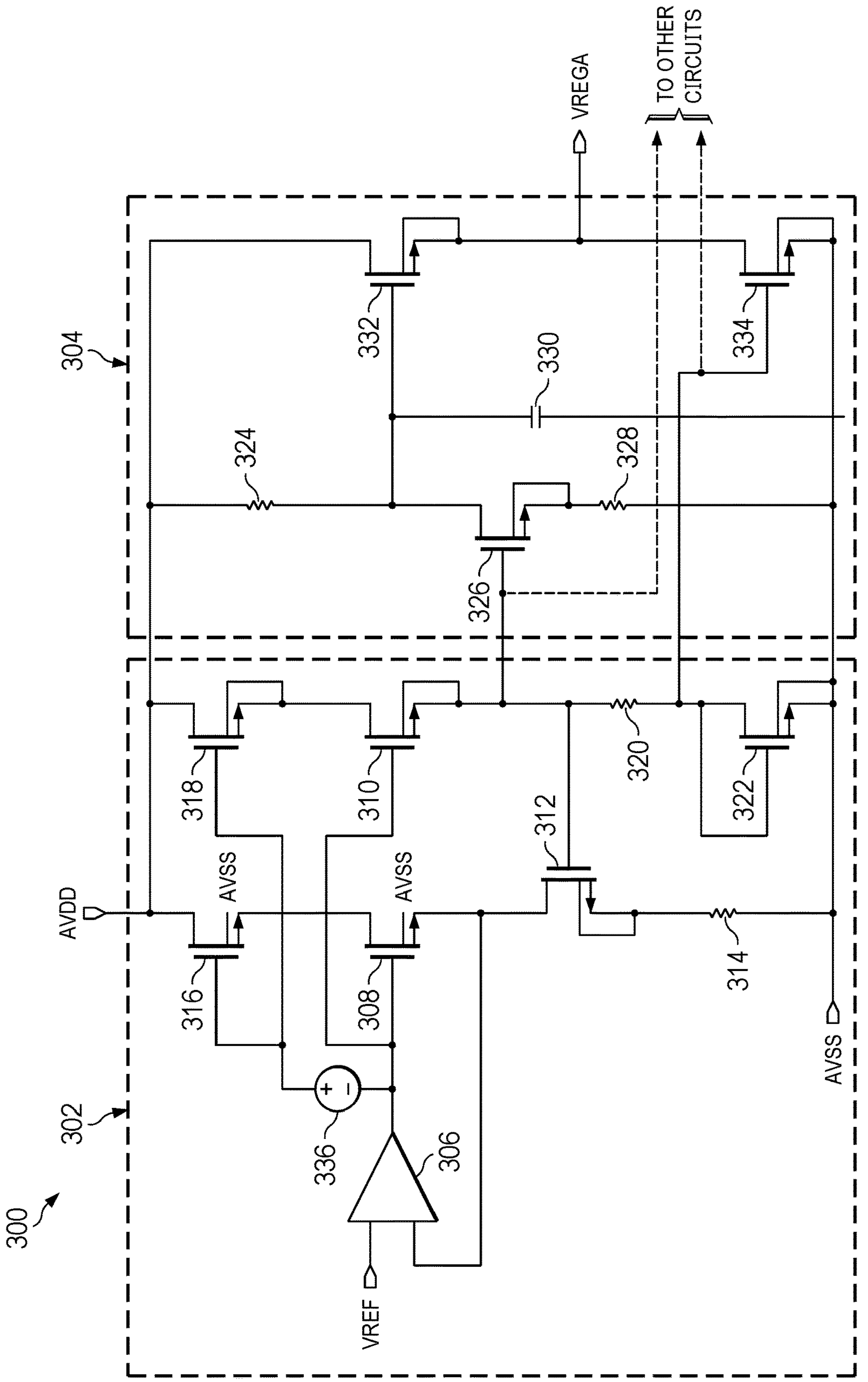
FIG. 3 is a schematic diagram of a switch regulator circuit suitable for use with the switch circuit of FIG. 2.

FIG. 3 is a schematic diagram of a switch regulator circuit 300 suitable for use with the switch 106. The switch regulator circuit 300 overcomes the body voltage effect of the transistor 204 in regard to its impedance match with the transistor 202. The switch regulator circuit 300 determines the actual body voltage effect and adds it as a correction to the control voltage provided to the transistor 202. While the impedance of the transistor 204 will be higher due to the body voltage effect thereof, the gate drive of the transistor 202 is reduced from its nominal AVDD-VREF voltage to an AVDD-VREF-ΔVBSeffect voltage to match impedances of the transistor 202 and the transistor 204.

The switch regulator circuit 300 includes a regulator core circuit 302 and an output circuit 304 coupled to the regulator core circuit 302. The regulator core circuit 302 generates an output that includes the back-body voltage effect of the transistor 204. The output circuit 304 generates a voltage output that is a power supply voltage (AVDD) less the voltage received from the regulator core circuit 302. The output voltage of the output circuit 304 can be used to control the transistor 202, such that the impedance of the transistor 202 is increased to match the impedance of the transistor 204.

The regulator core circuit 302 includes an amplifier 306, transistors 308, 310, 312, 316, 318, and 322, resistors 314 and 320, and a voltage source 336 (which provides a small voltage bias). A first amplifier input (e.g., a non-inverting input) of the amplifier 306 is coupled to a voltage reference terminal for receipt of VREF. An amplifier output of the amplifier 306 is coupled to a control terminal (e.g., gate) of the transistor 308. A body terminal of the transistor 308 is coupled to a reference voltage terminal (e.g., ground). A first current terminal (e.g., drain) of the transistor 308 is coupled to a power terminal providing AVDD via the transistor 316. A second terminal (e.g., source) of the transistor 308 is coupled to a second amplifier input (e.g., an inverting input) of the amplifier 306.

The output of the amplifier 306 is also coupled to a control terminal (e.g., gate) of the transistor 310. A first current terminal (e.g., drain) of the transistor 310 is coupled to the power terminal providing AVDD via the transistor 318. A second terminal (e.g., source) of the transistor 310 is coupled to a body terminal of the transistor 310.

The transistor 312 provides feedback from the transistor 310 to the amplifier 306. A control terminal (e.g., gate) of the transistor 312 is coupled to the second terminal of the transistor 310. A first terminal (e.g., drain) of the transistor 312 is coupled to the second input of the amplifier 306 and the second terminal of the transistor 308. A second terminal of the transistor 312 is coupled to a reference voltage terminal (e.g., AVSS, ground) via the resistor 314. The resistor 314 has a first terminal coupled to the second terminal of the transistor 312 and a second terminal coupled to the reference voltage terminal.

The resistor 320 and the transistor 322 are coupled in series between the second terminal of the transistor 310 and the reference voltage terminal. The transistor 322 is diode connected with a control terminal (e.g., gate) of the transistor 322 coupled to a first terminal (e.g., drain) of the transistor 322. A second terminal (e.g., source) of the transistor 322 is coupled to the reference voltage terminal.

Figure 4:
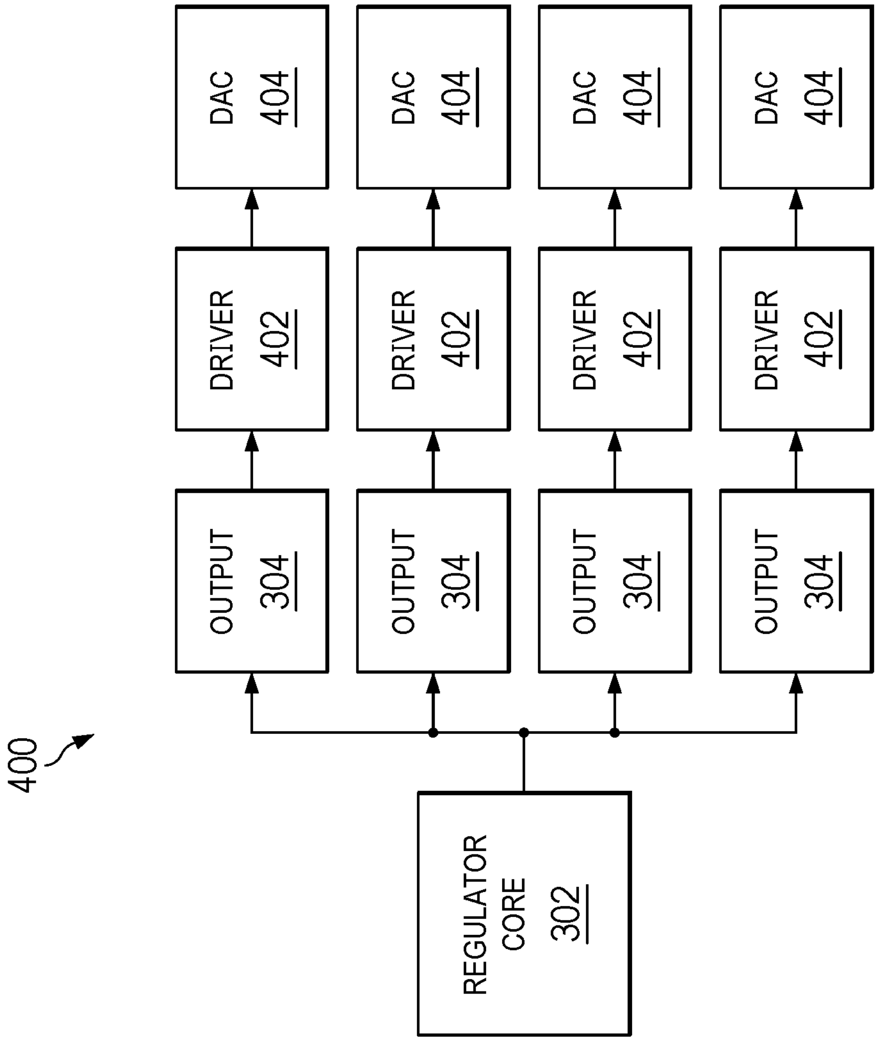
FIG. 4 is a block diagram of an example system that includes the switch regulator circuit of FIG. 3.

The resistor 320 has a first terminal coupled to the second terminal of the transistor 310 and a second terminal coupled to the first terminal of the transistor 322. The first and second terminals of the resistor 320 may also be coupled to other circuits, e.g., other instances of the output circuit 304 as shown in FIG. 4.

The transistor 316 is coupled between the power terminal and the transistor 308. A first terminal (e.g., drain) of the transistor 316 is coupled to the power terminal. A second terminal (e.g., source) of the transistor 316 is coupled to the first terminal of the transistor 308. A control terminal (e.g., gate) of the transistor 316 is coupled to the output of the amplifier 306 via the voltage source 336. The voltage source 336 may include one or more diode-connect transistors or a resistor and a current source coupled to the power terminal. The transistor 318 is coupled between the power terminal and the transistor 310. A first terminal of the transistor 318 is coupled to the power terminal. A second terminal of the transistor 318 is coupled to the first terminal of the transistor 310. A control terminal of the transistor 318 is coupled to the control terminal of the transistor 316.

The output circuit 304 includes transistors 326, 332 and 334, resistors 324 and 328, and a capacitor 330. A control terminal (e.g., gate) of the transistor 326 is coupled to the second terminal of the transistor 310. A first terminal (e.g., drain) of the transistor 326 is coupled to the power terminal via the resistor 324. A second terminal (e.g., source) of the transistor 326 is coupled to the reference voltage terminal via the resistor 328. The resistor 324 has a first terminal coupled to the power terminal and a second terminal coupled to the first terminal of the transistor 326. The resistor 328 has a first terminal coupled to the second terminal of the transistor 326 and a second terminal coupled to the reference voltage terminal.

The transistor 332 includes a first terminal (e.g., drain) coupled to the power terminal, and a control terminal (e.g., gate) coupled to the first terminal of the transistor 326. A second terminal (e.g., source) of the transistor 332 is coupled to a first terminal (e.g., drain) of the transistor 334. The reference voltage output (VREGA) of the switch regulator circuit 300 is provided at the second terminal of the transistor 332. The second terminal of the transistor 332 may be coupled to a voltage input of the driver circuit 206 (FIG. 2) so that the driver circuit 206 applies VREGA to control the transistor 202. A second terminal (e.g., source) of the transistor 334 is coupled to the reference voltage terminal, and a control terminal (e.g., gate) of the transistor 334 is coupled to the first terminal of the transistor 322. The capacitor 330 has a first terminal coupled to the control terminal of the transistor 332 and a second terminal coupled to the reference voltage terminal.

In operation, the amplifier 306 forces the second terminal of the transistor 308 to be at a same voltage as the first terminal of the amplifier 306 (e.g., VREF). The transistor 308 and the transistor 310 have a same control voltage, the output voltage of the amplifier 306. However, transistor 308, having its body terminal at GND will experience an increased VGS relative to transistor 310, which does not have any body voltage effect as the body terminal of the transistor 310 is connected back to its source. Since the gate voltage of transistors 308 and 310 is the same, the voltage seen at the source of transistor 310 will be higher than the voltage at the source of the transistor 308 by the difference in the body voltage effect of the transistors 308 and 310. This can be seen by analyzing the operation of the switch regulator circuit 300 starting at the source voltage of transistor 308. Transistor 308 source voltage will be held at VREF by the amplifier 306. The output voltage of the amplifier 306 and the gate voltage of the transistor 308 will therefore be VREF+$VGS_{308}$ (the VGS of the transistor 308). But since $VGS_{308}$ is essentially equal to the $VGS_{310}$ but with the increase of the body voltage effect on the transistor 308, $VGS_{308}$ can be written as:

$$VGS_{308} = VGS + \Delta VBSeffect \tag{1}$$

where VGS is the gate-to-source voltage of the transistor 310.

The voltage across the resistor 320 is:

$$VREF + VGS_{308} - VGS_{310} - VGS_{322} \tag{2}$$

The VGSs of the transistor 310 and the transistor 322 are the same, and the VGS of the transistor 308 is as per equation (1), allowing reduction of equation (2) to:

$$VREF + \Delta VBSeffect - VGS \tag{3}$$

The voltage across the resistor 314 is the same as the voltage across the resistor 320, and the current flowing through the resistor 314 is the same as the current flowing through the resistor 320. Accordingly, currents flowing through the transistor 308 and the transistor 310 are equal. The current flowing through the resistor 320 is:

$$\frac{VREF + \Delta VBSeffect - VGS}{R2} \tag{4}$$

where R2 is the resistance of the resistor 320.

The current flowing through the resistor 328 is the same as the current flowing through the resistor 320 (equation (4)), and the resistance of the resistor 320, the resistor 324, and the resistor 328 may be the same. Accordingly, the voltage at the first terminal of the transistor 326 and the gate of the transistor 332 may be expressed as:

$$AVDD - R3\frac{VREF + \Delta VBSeffect - VGS}{R2} \tag{5}$$

where AVDD is the voltage provided at the power supply terminal, and R3 is the resistance of the resistor 324.

Note that the voltage of equation (5) contains the AVDD-VREF relation, but also includes the ΔVBSeffect voltage. Finally, the output voltage of the switch regulator circuit 300 provided at the source of the transistor 322 is:

$$AVDD - VREF - \Delta VBSeffect \tag{6}$$

providing a proper regulator voltage for the transistor 202 to match the impedance of the transistor 204.

FIG. 4 is a block diagram of an example system 400 that includes the switch regulator circuit 300. The system 400 includes the regulator core circuit 302, multiple instances of the output circuit 304, multiple driver circuits 402, and multiple DACs 404. The output of the regulator core circuit 302 (e.g., taken at the first and second terminals of the resistor 320 shown in FIG. 3) is coupled to each output circuit 304 (e.g., coupled to the control terminals of the transistor 326 and 344 as shown in FIG. 3). Each instance of the output circuit 304 is coupled to a voltage input of an instance of the driver circuit 402, and an output of each instance of the driver circuit 402 is coupled to an instance of the DAC 404. The driver circuit 402 may be an implementation of the driver circuit 206. The driver circuit 402 provides the control signal VSWL, which swings to VREG provided by the output circuit 304, for controlling the switch 106 in the DAC 404. In the system 400, a single regulator core circuit 302 provides a voltage output for controlling any number of instances of the DAC 404, which reduces the circuitry of the system 400 and provides improved linearity in the DACs 404.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) (n-type transistor) or a p-channel FET (PFET)) (p-type transistor)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input (or transistor control terminal) is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A circuit comprising:

an amplifier having a first amplifier input coupled to a voltage reference terminal; a second amplifier input, and an amplifier output;

a first transistor having a first terminal coupled to a power terminal; a second terminal coupled to the second amplifier input; a body terminal coupled to a reference terminal; and a control terminal coupled to the amplifier output;

a second transistor having a first terminal coupled to the power terminal; a second terminal; a body terminal coupled to the second terminal of the second transistor; and a control terminal coupled to the amplifier output; and a third transistor having a first terminal coupled to the second amplifier input; a second terminal coupled to the reference terminal; and a control terminal coupled to the second terminal of the second transistor.

2. The circuit of claim 1, further comprising a first resistor having a first terminal coupled to the second terminal of the third transistor and a second terminal coupled to the reference terminal.

3. The circuit of claim 1, further comprising:

a fourth transistor having a first terminal, a second terminal coupled to the reference terminal, and a control terminal coupled to the first terminal of the fourth transistor; and a first resistor having a first terminal coupled to the second terminal of the second transistor and a second terminal coupled to the first terminal of the fourth transistor.

4. The circuit of claim 1, further comprising:

a fourth transistor having a first terminal; a second terminal, and a control terminal coupled to the second terminal of the second transistor;

a first resistor having a first terminal coupled to the power terminal and a second terminal coupled to the first terminal of the fourth transistor; and a second resistor having a first terminal coupled to the second terminal of the fourth transistor and a second terminal coupled to the reference terminal.

5. The circuit of claim 4, further comprising:

a fifth transistor having a first terminal coupled to the power terminal, a second terminal, and a control terminal coupled to the first terminal of the fourth transistor; and a sixth transistor having a first terminal coupled to the second terminal of the fifth transistor, a second terminal coupled to the reference terminal, and a control terminal coupled to second terminal of the second transistor.

6. The circuit of claim 4, further comprising a capacitor having a first terminal coupled to the first terminal of the fourth transistor and a second terminal coupled to the reference terminal.

7. The circuit of claim 1, further comprising:

a fourth transistor having a first terminal coupled to the power terminal, a second terminal coupled to the first terminal of the first transistor, and a control terminal;

a fifth transistor having a first terminal coupled to the power terminal, a second terminal coupled to the first terminal of the second transistor, and a control terminal coupled to the control terminal of the fourth transistor; and a voltage source having a first terminal coupled to the amplifier output and a second terminal coupled to the control terminal of the fifth transistor.

8. A circuit comprising:

an amplifier having a first amplifier input coupled to a voltage reference terminal; a second amplifier input, and an amplifier output;

a first transistor having a first terminal coupled to a power terminal; a second terminal coupled to the second amplifier input, a body terminal coupled to a reference terminal, and a control terminal coupled to the amplifier output;

a second transistor having a first terminal coupled to the power terminal; a second terminal, a body terminal coupled to the second terminal of the second transistor and a control terminal coupled to the amplifier output;

a third transistor having a first terminal coupled to the second amplifier input; a second terminal, and a control terminal coupled to the second terminal of the second transistor;

a resistor having a first terminal coupled to the second terminal of the second transistor, and a second terminal;

a fourth transistor having a first terminal, a second terminal, and a control terminal coupled to the second terminal of the second transistor;

a fifth transistor having a first terminal, a second terminal, and a control terminal coupled to the first terminal of the fourth transistor; and a sixth transistor having a first terminal coupled to the second terminal of the fifth transistor, a second terminal, and a control coupled to the second terminal of the resistor.

9. The circuit of claim 8, wherein:

the resistor is a first resistor; and the circuit includes:

a seventh transistor having a first terminal coupled to the second terminal of the first resistor, a second terminal coupled to the second terminal of the sixth transistor, and a control terminal coupled to the first terminal of the seventh transistor; and a second resistor having a first terminal coupled to the second terminal of the third transistor and a second terminal coupled to the second terminal of the seventh transistor.

10. The circuit of claim 8, further comprising a seventh transistor having a first terminal coupled to a power terminal, a second terminal coupled to the first terminal of the second transistor, and a control terminal coupled to the amplifier output.

11. The circuit of claim 10, further comprising an eighth transistor having a first terminal coupled to the power terminal, a second terminal coupled to the first terminal of the first transistor, and a control terminal coupled to the control terminal of the seventh transistor.

12. The circuit of claim 10, further comprising a voltage source having a first terminal coupled to the amplifier output and a second terminal coupled to the control terminal of the seventh transistor.

13. The circuit of claim 8, wherein:

the resistor is a first resistor; and the circuit includes:

a second resistor having a first terminal coupled to the first terminal of the fifth transistor and a second terminal coupled to the first terminal of the fourth transistor; and a third resistor having a first terminal coupled to the second terminal of the fourth transistor and a second terminal coupled to the second terminal of the sixth transistor.

14. The circuit of claim 8, further comprising a capacitor having a first terminal coupled to the control terminal of the fifth transistor and a second terminal coupled to the second terminal of the sixth transistor.

15. The circuit of claim 8, wherein:

the resistor is a first resistor; and the circuit includes a second resistor having a first terminal coupled to the second terminal of the third transistor and a second terminal coupled to the second terminal of the sixth transistor.

16. A digital-to-analog converter comprising:

a resistor ladder;

a switch circuit coupled to a rung of the resistor ladder, the switch circuit including a first switch having a control input and a second switch having a control input;

a first driver circuit having an output coupled to the control input of the first switch;

a second driver circuit having an output coupled to the control input of the second switch, and a voltage input;

a switch regulator circuit having an output coupled to the voltage input of the second driver circuit, the switch regulator circuit including:

an amplifier having a first amplifier input coupled to a voltage reference terminal; a second amplifier input, and an amplifier output;

a first transistor having a first terminal coupled to a power terminal; a second terminal coupled to the second amplifier input, a body terminal coupled to a reference terminal, and a control terminal coupled to the amplifier output;

a second transistor having a first terminal coupled to the power terminal; a second terminal, a body terminal coupled to the second terminal of the second transistor, and a control terminal coupled to the amplifier output; and a third transistor having a first terminal coupled to the second amplifier input, a second terminal coupled to the reference terminal, and a control terminal coupled to the second terminal of the second transistor.

17. The digital-to-analog converter of claim 16, further comprising a first resistor having a first terminal coupled to the second terminal of the third transistor and a second terminal coupled to the reference terminal.

18. The digital-to-analog converter of claim 16, further comprising:

a fourth transistor having a first terminal, a second terminal coupled to the reference terminal, and a control terminal coupled to the first terminal of the fourth transistor; and a first resistor having a first terminal coupled to the second terminal of the second transistor and a second terminal coupled to the first terminal of the fourth transistor.

19. The digital-to-analog converter of claim 16, further comprising:

a fourth transistor having a first terminal; a second terminal, and a control terminal coupled to the second terminal of the second transistor;

a second resistor having a first terminal coupled to the power terminal and a second terminal coupled to the first terminal of the fourth transistor; and a third resistor having a first terminal coupled to the second terminal of the fourth transistor and a second terminal coupled to the reference terminal.

20. The digital-to-analog converter of claim 19, further comprising:

a fifth transistor having a first terminal coupled to the power terminal, a second terminal coupled to the voltage input of the second driver circuit, and a control terminal coupled to the first terminal of the fourth transistor; and a sixth transistor having a first terminal coupled to the second terminal of the fifth transistor, a second terminal coupled to the reference terminal, and a control terminal coupled to the second terminal of the second transistor.

* * * * *